United States Patent [19]

Marancik

[11] 4,411,712

[45] Oct. 25, 1983

[54] METHOD OF MANUFACTURE OF MULTIFILAMENTARY INTERMETALLIC SUPERCONDUCTORS

[75] Inventor: William G. Marancik, Basking Ridge, N.J.

[73] Assignee: Airco, Inc., Montvale, N.J.

[21] Appl. No.: 426,432

[22] Filed: Sep. 29, 1982

Related U.S. Application Data

[63] Continuation of Ser. No. 216,475, Dec. 15, 1980, abandoned.

[51] Int. Cl.$^3$ ............................................. H01L 39/24
[52] U.S. Cl. .............................. 148/11.5 Q; 29/599; 148/11.5 P; 148/11.5 F; 148/11.5 C
[58] Field of Search ...................... 148/11.5 Q, 11.5 P, 148/11.5 F, 11.5 C; 29/599

[56] References Cited

U.S. PATENT DOCUMENTS

| | | | |
|---|---|---|---|
| 3,277,557 | 10/1966 | Ham | 148/11.5 Q |
| 3,472,705 | 10/1969 | Gregory | 29/599 |
| 3,496,622 | 2/1970 | Berghout et al. | 29/599 |
| 3,509,622 | 5/1970 | Bernert | 29/599 |
| 3,541,680 | 11/1970 | Verrijp | 29/599 |
| 4,044,457 | 8/1977 | Strauss | 29/599 |
| 4,223,434 | 9/1980 | Wang et al. | 29/599 |

OTHER PUBLICATIONS

Patent Abstracts of Japan, vol. 2, No. 33, Section E, Mar. 6, 1978.

*Primary Examiner*—W. Stallard
*Attorney, Agent, or Firm*—Larry R. Cassett

[57] ABSTRACT

An improved method for manufacture of multifilamentary superconductors of the A$_3$B type having the A-15 crystal structure, such as Nb$_3$Sn, is disclosed in which rods or wires of the A material are disposed throughout a matrix consisting of Cu and the B material in substantially elemental form. The matrix is formed by compaction of powders of Cu; powders of the B may be mixed therewith or the B material may be infiltrated into pores between the individual Cu particles after compaction. The resultant composite has A, B and Cu distributed uniformly throughout its volume and can be worked to any desired final shape and size for heat treatment to form the A$_3$B material without intermediate annealing steps.

15 Claims, 10 Drawing Figures

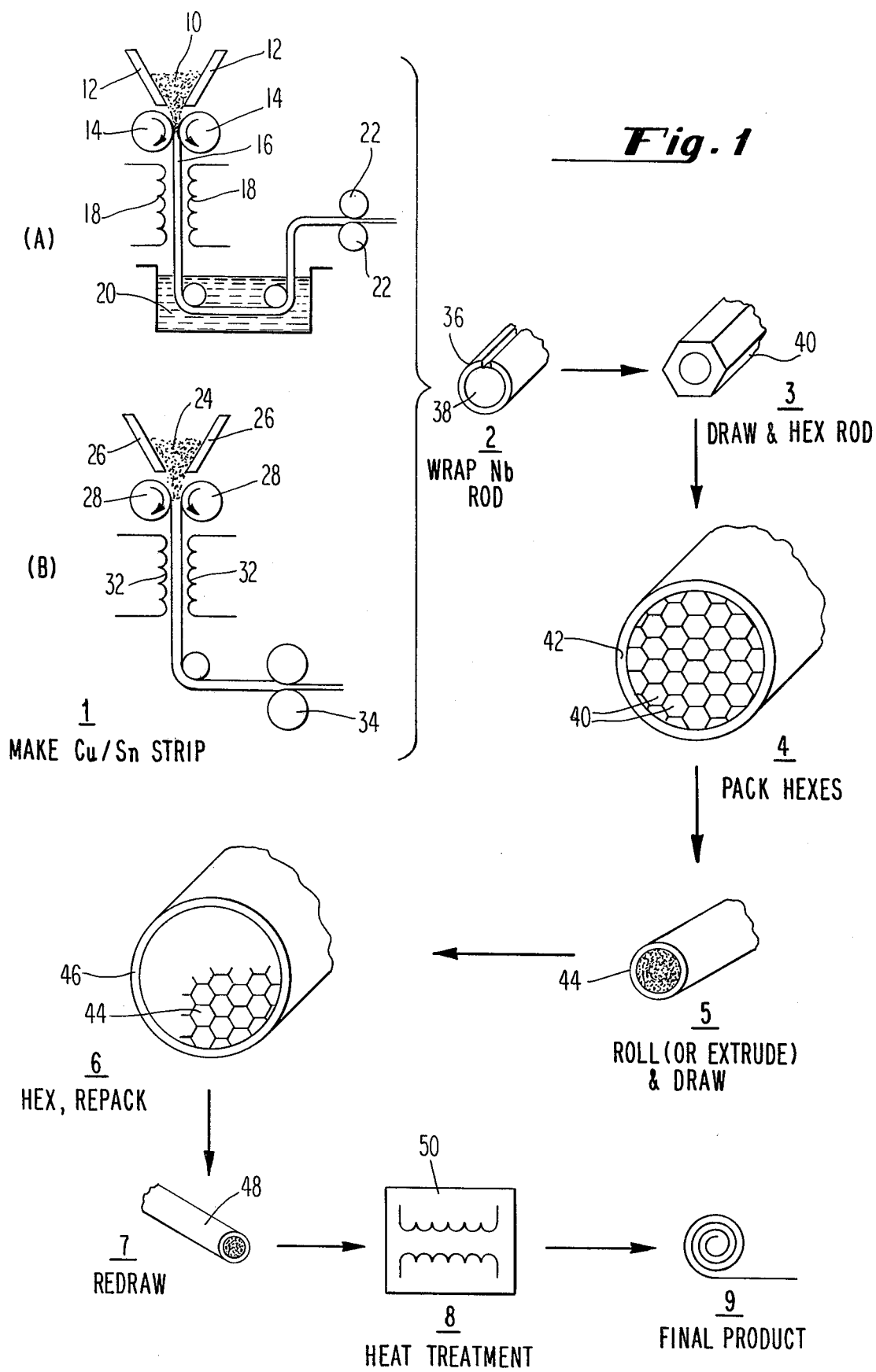

METHOD OF MANUFACTURE OF MULTIFILAMENTARY INTERMETALLIC SUPERCONDUCTORS

This is a continuation of application Ser. No. 216,475, filed Dec. 15, 1980, now abandoned.

FIELD OF THE INVENTION

This invention relates to the field of manufacture of multifilamentary intermetallic superconductors of the A-15 type such as $Nb_3Sn$ or $V_3Ga$; more particularly, it relates to such a method which does not involve the so-called bronze process.

BACKGROUND OF THE INVENTION

The phenomenon of superconductivity, that is, zero electrical resistance, possessed by many metals at near absolute zero temperatures, has received steadily increasing attention in recent years due to the development of materials which exhibit this property at sufficiently high temperatures while carrying relatively high currents in the presence of sufficiently great magnetic fields as to be of commercial utility. See generally, "Superconductors in Electric Power Technology", Geballe et al, *Scientific American, Vol.* 243 No. 5 pp. 138–172 (November, 1980). Among the more useful of the superconducting materials developed to data are the intermetallic compounds $Nb_3Sn$ and $V_3Ga$. These materials have sufficiently good superconductive properties as to render them attractive in the development of useful electrical machinery. However, the manufacture of these intermetallic compounds is complicated both by the nature of the compounds themselves, which are metastable phases not readily manufacturable by simple chemical processes, and which are so brittle that the bending of a conductor formed of either of these compounds is substantially precluded, and by the preferred design of conductors using these materials, which generally require many individual filaments of the superconductive material to be imbedded in a matrix of a non-superconductive material, preferably a metal having high electrical conductivity such as pure Cu.

Early attempts at manufacture of filamentary wires of, for example, $Nb_3Sn$ are shown in Berghout et al U.S. Pat. No. 3,496,622 in which mixed Nb and Sn powders are packed in a wrapped sheath of, for example, Mo; this structure is then drawn to a fine wire size and heat treated to form the $Nb_3Sn$ compound desired. However, this method does not lend itself readily to the production of multifilamentary wires; moreover, the Mo sheath is undesirable as it is preferable to have a material of high electrical conductivity such as Cu in direct contact with or disposed in close juxtaposition to the $Nb_3Sn$ superconductive material. An improvement on the Berghout et al method was shown in U.S. Pat. No. 3,541,680 to Verrijp in which a small quantity of Cu, Ag, Au, Pt or Pd is added to the Nb and Sn powder mixture to inhibit the formation of intermetallic compounds other than the $Nb_3Sn$ such as $Nb_6Sn_5$ or $NbSn_2$.

More recently developed processes for the manufacture of $Nb_3Sn$ have generally involved the so-called bronze process in which rods or wires of Nb are dispersed throughout a matrix consisting of a CuSn bronze. The assembly is worked to a desired final size and heat treated at which time $Nb_3Sn$ is formed at the interfaces between the Nb rods and the bronze matrix by diffusion of the Sn from the bronze. See, for example, U.S. Pat. No. 3,918,998, assigned to the assignee of the present application. Refinements to the bronze process include providing a quantity of good electrical conductor such as pure Cu in close proximity to the $Nb_3Sn$ filaments and isolating this pure Cu from diffusion of Sn which would destroy the high electrical conductivity of pure Cu by interposing a layer of material impermeable to Sn therebetween such as, for example, Ta; see, e.g., U.S. Pat. No. 4,205,199, also assigned to the assignee of the present invention. The same process is used to form multifilamentary $V_3Ga$; V rods are disposed in a CuGa bronze matrix.

The bronze process, while feasible, is not the ideal method of manufacture of a mutifilamentary superconductor of the A-15 type. Its chief drawback is the fact that the bronze used to supply Sn to the Nb rods or filaments for the formation of $Nb_3Sn$ work hardens very quickly during the multiple metal working operations such as rolling, drawing, extrusion, swaging, and the like carried out to form the multifilamentary conductor, thus necessitating time consuming and costly annealing operations. Moreover, the amount of Sn which can be alloyed with Cu to form the bronze is limited to approximately 15%, as beyond this level, the bronze is prohibitively hard to work. Accordingly, a need remains in the art for an improved process for the manufacture of multifilamentary superconductors of the A-15 type.

During the development of the bronze process as outlined above, attention has continued to be paid to various powder metallurgical methods of manufacture of A-15 type superconductors. A tape of $Nb_3Sn$ was manufactured by Lawrence Berkeley Laboratories by compacting Nb powder to form a tape having approximately 25% porosity. This tape was then immersed in molten Sn, which infiltrated the pores. Cold working was then carried out to form the tape to a final size, at which time a high temperature heat treatment was performed to form the $Nb_3Sn$ product. A similar process could be used to form a rod-shaped conductor; thereafter, pluralities of such conductors could be jacketed in, e.g., Cu, packed together and extruded to form a multifilamentary $Nb_3Sn$ superconductor. However, while this process avoids work hardening of bronze, it is unduly complex and expensive for reasonable quantity production of $Nb_3$ Sn. A similar method, shown in U.S. Pat. No. 4,223,434 to Wang et al, yields $Nb_3(Al,Ge)$ material (also an A-15 compound) and also involves manufacture of a porous Nb preform. The AlGe alloy is infiltrated into these pores; upon performance of a complex heat treatment, differing compounds of Nb with Ge and Al are formed in sequence. Again, this method is too elaborate to permit adaptation to economic volume production of $Nb_3Sn$.

Another alternative to the bronze process, shown in U.S. Pat. No. 4,224,735 to Young et al assigned to the assignee of the present invention, involves disposition of elemental Sn in layers not thicker than a predetermined dimension separated by Cu layers around a Cu matrix containing Nb filaments. This method allows working of a conductor precursor without work hardening of bronze, but is somewhat complex to implement on a commercial scale. Moroever, the Sn is not disposed uniformly with respect to the Nb.

A final possibility which has been suggested in the art but which has not achieved commercial success is shown in U.S. Pat. Nos. 3,838,503 and 3,829,963, among others. Here Sn is added to the exterior of a previously formed wire comprising multifilamentary Nb in a Cu matrix and diffused inwardly under a high temperature heat treatment. The Sn may be applied by dipping, plating or other means. This method is limited severely in the amount of Sn which can be caused to diffuse through such a matrix. In particular, the fact that Sn is not disposed uniformly throughout the conductor prohibits maximization of the Nb₃Sn formed, and hence limits the maximum current density of the eventual conductor.

Therefore, there exists a distinct need in the art for an improved method of formation of Nb₃Sn multifilamentary superconductors which does not involve working of a CuSn bronze, does not involve diffusion of Sn inwardly from the exterior of a Nb-in-Cu composite wire, and which does not involve the infiltration of a Nb matrix with Sn or other material which forms a superconductive compound with Nb.

OBJECT OF THE INVENTION

It is therefore a primary object of the invention to provide an improved and less expensive method of manufacture of a multifilamentary superconductor of the A-15 type.

A further object of the invention is to provide a method of manufacture of a multifilamentary superconductor which does not involve the mechanical working of a bronze matrix.

A further object of the invention is to provide a method for manufacture of a multifilamentary superconductor which has a high volume density of Nb₃Sn filaments.

Yet another object of the invention is to provide a simplified method of fabricating a multifilamentary superconductor without the need for intermediate annealing heat treatments.

SUMMARY OF THE INVENTION

The above objects of the invention and needs of the art are satisfied by the present invention, which comprises a method for the manufacture of a multifilamentary superconductor of the A-15 type having the formula A₃B, in which the A material is distributed in the forms of rods or wires within a matrix comprising a porous Cu structure having the B material disposed in pores in the Cu structure. In this way, the B material is disposed throughout the matrix in elemental form, unalloyed with the Cu, so that the work-hardening encountered during mechanical forming of bronze is eliminated, while the percentage of B material available to form the A₃B superconductive material is not limited by this factor. Furthermore, the fact that the B material is distributed substantially uniformly throughout the matrix means that it is in close proximity to all of the A filaments for formation of A₃B superconductive material during diffusion heat treatment. The matrix of the Cu and elemental B material may be made by either of several processes; in particular, it may comprise a sintered mixture of powdered Cu and the B material or may comprise a matrix of sintered Cu powder, having had the B material infiltrated into the pores between the powder particles after formation of the porous Cu matrix.

BRIEF DESCRIPTION OF THE DRAWING

The invention will be better understood if reference is made to the accompanying drawing which shows successive stages in the manufacture of multifilamentary intermetallic superconductors according to process of the invention.

DESCRIPTION OF THE PREFERRED EMBODIMENTS

Several different types of compounds having the A-15 crystal structure and the chemical formula A₃B are known to be useful superconductors, chiefly Nb₃Sn and V₃Ga; the present invention is to some degree applicable to all of these compounds. However, it will be described solely in terms of Nb₃Sn for clarity's sake, and inasmuch as this is presently the A-15 compound which appears most likely to become a commercially useful material.

The method of the invention involves assembling a plurality of rods or wires of Nb in a matrix consisting of a composite of elementary Cu and Sn, working this assembly to a desired shape and size, and then performing a reaction heat treatment to from Nb₃Sn at the interfaces between the Nb and the CuSn matrix. In this way, extensive processing can be carried out without the workhardening of a CuSn-bronze alloy material, and intermediate annealing heat treatements can be avoided. The process will be described in detail and reference made to FIG. 1, which shows nine stages, numbered 1 through 9, in the manufacture of a multifilamentary Nb₃Sn superconductor according to the invention.

Step 1 comprises two alternatives denoted (A) and (B) on FIG. 1. In step 1(A), Cu powders indicated at 10 are disposed in a hopper 12 and gravity fed between two powered rollers 14 which compress the powder 10 to form a "green" strip 16 which may be on the order of, e.g., 30% porous. The green strip 16 may then be heat treated by a heater indicated at 18 to sinter it; control of the time and temperature of heating and the pressure exerted will govern the relative porosity of the strip. The sintered strip is then passed through a bath of molten Sn indicated generally at 20. The molten Sn will tend to be infiltrated into the pores of the green strip thus forming a Cu/Sn composite strip, but in which the Sn is not alloyed with the Cu. Pressure may be useful in this step to ensure uniform infiltration. The composite Cu/Sn strip can then be passed through a second pair of rolls 22 for further compaction and strengthening and might advantageously be heated as well.

In step 1(B) the particles 24 compacted are instead a mixture of Cu and Sn powders. Again the powder is fed from a hopper 26 through a pair of compacting rolls 28 and the green strip 30 thus formed is passed through a heater 32 to cause a good bond to be formed between the various particles. The strip can then be passed through a second pair of compacting rolls 34 to further consolidate it. It will be understood that the strip 30 should not be heated by heater 32 to a temperature high enough to cause the Cu and Sn to alloy to form a bronze. This would largely eliminate the advantages provided by the method of the invention. Instead, a temperature no greater than the melting temperature of Sn should be reached, which would allow the Sn to wet the Cu particles, thus essentially soldering the composite powders into a relatively durable and workable strip form.

In step 2 the Cu/Sn strip 36, whether a combination of Cu and Sn powders worked into a strip, or a porous Cu strip having had Sn impregnated therein, is wrapped around an Nb rod 38. This can be done readily on presently available equipment, in a substantially continuous process. Hence, the length of the Nb core/CuSn sheathed rod is unlimited, which is useful for reasons to be discussed below.

Next, in step 3, the composite rod 40 is shown having been drawn and formed to a hex cross-section. As is known a plurality of such hexed rods 40 may be efficiently packed into a tube 42, as in step 4; the tube 42 may be formed of pure Cu, for stabilization of the superconductor, and may be lined with a layer (not shown) of a diffusion barrier material such as Ta or other material impervious to diffusion of Sn, so as to retain the high conductivity of the pure Cu after heat treatment, all as described in the prior art patents referred to above. Long lengths (e.g. 3 m) of hexed Nb/CuSn ords of on the order of 6 mm flat-to-flat dimensions may be wrapped by a Cu strip in this step, and the edges of the strip welded to form a tube, e.g., 10 cm in diameter. An assembly of these dimensions can be drawn and/or rolled (step 5) to a long length of fine wire size without extrusion, which is desirably avoided as it can involve high local temperatures resulting in the formation of undesired compounds. However, if for example in order to ensure bonding extrusion is deemed desirable, various expedients can be employed; as shown, the outermost layer of hexed rods 40 may be pure Cu, and the entire assembly turned to a cylinder to fit within an extrusion can 42. In step 6, many lengths of this wire 44 may again be hexed and packed into a second Cu tube 46 for further working. Again a Ta or other barrier layer (not shown) can be interposed between the hexed rods and the Cu tube 46 if it is deemed desirable to protect this material from Sn diffusion during the heat treatment employed to form Nb$_3$Sn. An alternative would be to coat the exteriors of the hexed rods 44 with the barrier material prior to assembly into the second tube 46.

In step 7 the assembly formed during step 6 is shown having been again drawn to a relatively fine wire size. If desired, the wire may be wound on a coil or otherwise formed into a desired shape. This is then heat treated in an oven 50 in step 8 to cause the Sn to diffuse from the Cu/Sn matrix and to form Nb$_3$Sn at the interfaces between the Nb filaments and the Cu/Sn matrix. The Cu and the remaining Sn will be homogenized to bronze. This yields the final product of step 9, a fine wire having multiple Nb$_3$Sn filaments in a CuSn bronze matrix, having pure Cu disposed in close proximity to the filaments, so as to provide stabilization.

It will be appreciated by those skilled in the art that there has been described a method for making such a product which does not involve the mechanical working of a bronze alloy material, so that work-hardening is avoided and that therefore the process according to the invention substantialy simplifies the manufacture of multifilamentary Nb$_3$Sn conductors. Moreover, the method of the invention does not involve diffusion of Sn into a conductor from its outer surfaces. The method has the further advantage that the powders which are used to manufacture the matrix are relatively inexpensive Cu/Sn powders rather than expensive Nb powders as shown in certain prior art methods referred to above, and also that a long continuous length of conductor can be manufactured without necessity of extrusion.

Those skilled in the art will also recognize that where not specified as essential to the method of the invention, numerous prior art techniques may be employed. For example, a process featuring packing of hexed composite rods into a long tube has been described; this could of course be replaced by, e.g., a process in which a plurality of the wires such as formed in step 3 could be cabled and inserted into a sheath for compaction by rolling or drawing. Extrusion might be useful in some cases, despite the drawbacks mentioned above. Similarly, the heat treatment performed in step 8 to form Nb$_3$Sn from the precursor materials will be in accordance with those performed in the prior art. For example, such a heat treatment might involve heating to between 500° and 750° C. in an inert atmosphere for a period of on the order of 3–6 days. As in the prior art, a two stage heat treatment process may also be employed, wherein a first relatively lower temperature is held for several hours during which time the Sn and Cu will homogenize to form a bronze material which would be followed by a second, higher temperature, heat treatment as outlined above to form the Nb$_3$Sn. A relatively small amount of additional working might be interposed between the first and second heat treatment to eliminate voids resulting from the reduction of volume of the alloy matrix as compared with the compacted powders—so-called "Kirkendall porosity."

It will also be appreciated by those skilled in the art that the method of the invention allows the superconductor designer to select, within relatively wide limits, any desired proportion of Sn and that this may be combined with selection of the Nb dimensions of the rods or wires to yield wide versatility in the design of conductors according to the invention. It is envisioned that a CuSn matrix formed by either of the methods outlined above can be designed to have an overall Sn of between about 15 and about 50% by weight. This is in distinct contrast to the bronze process of the prior art in which the work-hardening of the bronze limited the maxiumum Sn content to about 15% by weight. The present invention thus provides additional versatility in conductor design, as well as avoiding work-hardening of the matrix, thus simplifying and rendering considerably less expensive the method of the invention.

Those skilled in the art will recognize that while the dimensions of the starting materials for the process of the invention are not rendered critical thereby circumstances may render certain dimensional choices more desirable than others. For example, Nb wire is presently available in diameters down to about 0.010 inches (0.025 cm). It is not difficult to encase individual wires of this dimension in Cu/Sn composite strips as in step 2 above. Such a composite wire can then be hexed and packed into a Cu extrusion can or tube for further processing without additional working being performed on the composite. Other choices and refinements will be evident to those skilled in the art; for example, it is known that up to about 20% by weight Cu can be added to Sn without causing it to work harden, but making it easier to handle; therefore, "Sn" herein should be construed to include such alloys.

Finally, common to all the embodiments described above and to many other variations which will readily be apparent to those skilled in the art is the fact that the invention provides a viable method for fabricating multifilamentary Nb$_3$Sn superconductors from readily available forms of Cu, Sn and Nb. The fabrication method of the invention eliminates the prior art bronze process, according to which bronze had to be specially cast, while giving the superconductive designer complete freedom is selecting a desired Sn to Cu to Nb ratio. The novel method of manufacture of the conductor also eliminates the need to drill long small diameter holes in a Cu or CuSn bronze billet to accommodate the Nb rods in proper disposition, as is now common in the prior art, while retaining the advantage of that method in that the Nb and Sn are evenly distributed throughout the Cu so as to provide a uniform final product. This uniform distribution also significantly reduces the length of time required for the heat treatment during which the Nb$_3$Sn is formed. It will also be realized by those skilled in the art that while a wire configured multifilamentary conductor has been described, the process of the invention is equally applicable to other forms of conductors, particularly tapes, which are of utility in certain applications, and that while the description of the preferred embdiments has been in terms of Nb$_3$Sn the method of the invention is also useful with respect to other A-15 structured superconductive materials such as V$_3$Ga. Therefore, the above description of the invention should be viewed as exemplary only and not as a limitation on its scope, which is more properly defined by the following claims.

I claim:

1. A method for manufacturing a multifilamentary superconductor having the composition A$_3$B and the A-15 crystal structure, comprising the following steps:
    encasing one or more rods or wires of the A material within a sheath of a material consisting essentially of a compacted composite of Cu and the B material said composite being formed by compaction of Cu powder into a porous matrix, sintering said porous matrix, and dipping said porous matrix into a bath of the B material, whereby said B material is infiltrated into the pores in said sintered porous Cu matrix;
    working the sheathed rods to firmly consolidate said composite upon said rods;
    packing a plurality of the worked sheathed rods together;
    further working the assembled plurality of sheathed rods to a desired final shape and size; and
    subjecting the worked assembly to a heat treatment for a time and at a temperature such that the compound A$_3$B is formed at the interfaces between the rods of the A material and the composite material.

2. The method of claim 1 wherein the A material is Nb and the B material is Sn.

3. The method of claim 1 wherein the A material is V and the B material is Ga.

4. A method of manufacture of a multifilamentary superconductor of the type in which a predetermined number of fine filaments of intermetallic superconductive material having the composition A$_3$B and the A-15 crystal structure are embedded in a matrix of normal conductor, which comprises:
    disposing wires of the A material in a matrix consisting of Cu and the B material, said Cu and said B material having substantially unalloyed, said matrix being formed by compaction of elemental powder of Cu to form a porous matrix and susequent infiltration of the B material into the pores of said porous matrix;
    working the assembly of wires of the A material and said matrix to a desired final shape and size; and
    performing a heat treatment to form said superconductive compound at the interfaces between said wires and said composite matrix.

5. The method of claim 4 wherein the A material is Nb and the B material is Sn.

6. The method according to claim 4 wherein the A material is V and the B material is Ga.

7. The method for manufacture of multifilamentary superconductive wire, comprising the steps of:
    preparing a composite material, consisting essentially of Cu and Sn, by compaction of powders;
    sheathing rods of Nb in strips of said composite material;
    drawing said sheathed Nb rods to an intermediate size;
    packing a plurality of said drawn rods within a generally tubular structure;
    reducing said tubular structure containing said rods to a desired final shape and size; and
    heat treating said structure at its final size to form Nb$_3$Sn about said rods of Nb.

8. The method of claim 7 wherein said composite is formed by compaction of Cu powders into a porous matrix, sintering of said matrix, and subsequent infiltration of Sn into pores of said matrix.

9. The method of claim 8 further comprising the additional step of heat treatment of said infiltrated matrix prior to said sheathing step at a temperature such that said Sn does not alloy with said Cu.

10. The method of claim 7 wherein said composite is formed by compaction of a mixture of Cu and Sn powders.

11. The method of claim 10 further comprising the additional step of heat treatment of said Cu/Sn composite at a temperature such that said Sn and said Cu do not alloy.

12. The method of claim 7 wherein an intermediate heat treatment is performed on said structure containing said rods prior to the heat treatment during which Nb$_3$Sn is formed, during which said Sn and Cu are alloyed.

13. The method of claim 12 wherein mechanical working is performed on said structure containing said rods after said intermediate heat treatment, to eliminate porosity formed during said intermediate heat treatment.

14. In a method of manufacture of a multifilamentary superconductor of the A-15 type having the composition A$_3$B, comprising the steps of forming a precursor assembly comprising Cu, A and B, said A being disposed in filamentary form substantially uniformly throughout a matrix of Cu and B, said matrix being formed by compaction of Cu powder into a porous matrix, sintering said porous matrix and subsequent infiltration of the B material into the pores of said porous matrix, working said assembly to a desired finished shape and size, and performing a reaction heat treatment to form A$_3$B at the interfaces between said A filaments and the matrix, the improvement which comprises said Cu and B materials being substantially not alloyed during said working, and said B material being disposed uniformly throughout said matrix.

15. The method of claim 14 wherein said assembly is formed by packing together a plurality of rods of the A material, each sheathed in a composite of Cu and the B material.

* * * * *

UNITED STATES PATENT AND TRADEMARK OFFICE
CERTIFICATE OF CORRECTION

PATENT NO. : 4,411,712
DATED : October 25, 1983
INVENTOR(S) : William G. Marancik It is certified that error appears in the above-identified patent and that said Letters Patent are hereby corrected as shown below:

Column 1, line 28, "data" should be --date--.

Column 4, line 19, "from" should be --form--.

Column 4, line 23, "treatements" should be --treatments--.

Column 5, line 13, "ords" should be --rods--.

Column 6, line 30, after "Sn" should be the word --content--.

Column 6, lines 34-35, "maxiumum" should be --maximum--.

Column 7, line 13, "embdiments" should be --embodiments--.

Column 7, line 55, "having" should be --being--.

Signed and Sealed this

Tenth Day of April 1984

[SEAL]

Attest:

GERALD J. MOSSINGHOFF

Attesting Officer    Commissioner of Patents and Trademarks